United States Patent [19]
Kintz et al.

[11] Patent Number: 5,086,209
[45] Date of Patent: Feb. 4, 1992

[54] HOT AIR APPARATUS FOR GLOSSING SHEETS

[75] Inventors: Karl A. Kintz, Kettering; Russell K. Messer, II, Franklin; Carl W. McCrary, Jr., West Carrollton; Erik K. Nelson, Centerville, all of Ohio

[73] Assignee: The Mead Corporation, Dayton, Ohio

[21] Appl. No.: 155,795

[22] Filed: Feb. 16, 1988

[51] Int. Cl.⁵ .............................................. G03G 15/20
[52] U.S. Cl. .................................. 219/216; 355/200; 219/400
[58] Field of Search ...................... 219/216, 388, 400; 355/3 FU, 14 FU

[56] References Cited
U.S. PATENT DOCUMENTS

| | | | |
|---|---|---|---|
| 3,219,799 | 11/1965 | Trumbull | 219/216 |
| 3,440,944 | 4/1969 | Endermann | 219/216 |
| 3,492,458 | 1/1970 | White | 219/216 |
| 3,498,592 | 3/1970 | Moser | 219/388 |
| 3,517,164 | 6/1970 | Huggins | 219/216 |
| 4,015,103 | 3/1977 | Cherian | 219/216 |
| 4,155,294 | 5/1979 | Langhammer | 219/400 |
| 4,160,595 | 7/1979 | Ito | 219/216 |

*Primary Examiner*—Teresa J. Walberg
*Attorney, Agent, or Firm*—Thomas A. Poshinski

[57] ABSTRACT

An apparatus is for glossing a sheet having a thermoplastic resin on the surface thereof. The thermoplastic resin is capable of forming a film which imparts gloss upon the application of heat. The apparatus includes a sheet support, a first pair of rollers for feeding the sheet onto the sheet support wherein the resin side of the sheet is away from the sheet support, heating elements, a blower for blowing air through the heating elements to generate hot air which is blown onto the sheet, and a second pair of cold rollers for receiving the sheet after passage over the sheet support.

4 Claims, 3 Drawing Sheets

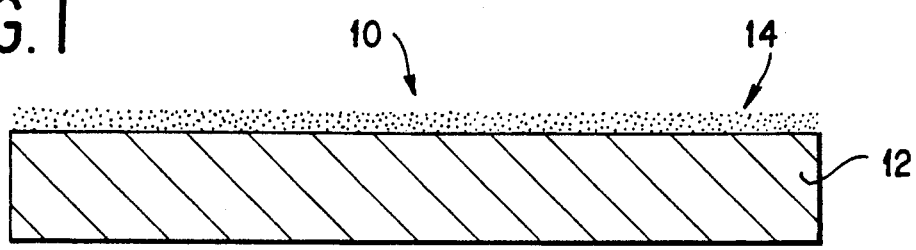
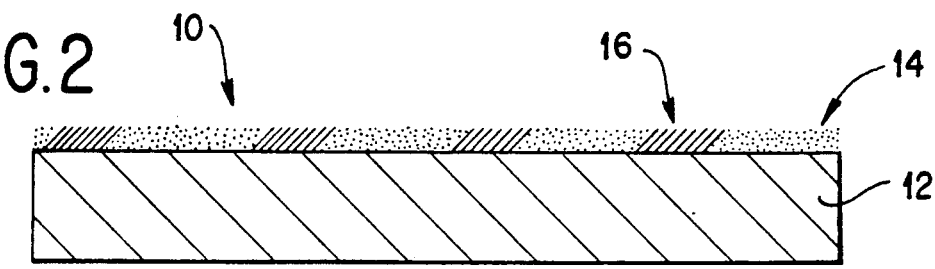
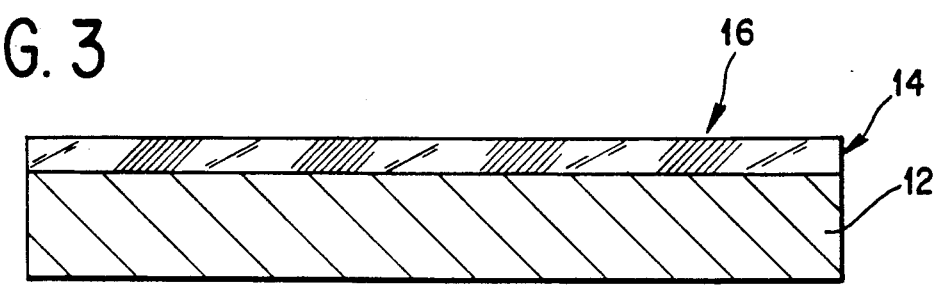
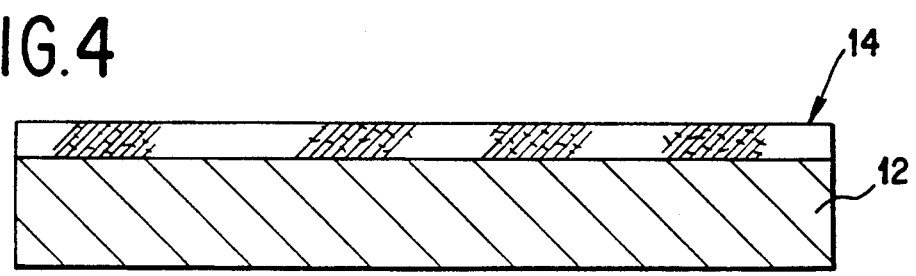

HOT AIR APPARATUS FOR GLOSSING SHEETS

BACKGROUND OF THE INVENTION

The present invention relates to apparatus for glossing sheets, and more particularly, to apparatus for glossing developer sheets.

Apparatus for the application of heat to coated substrates are known. For example, see U.S. Pat. Nos. 1,399,160; 1,913,704; 3,349,222; 3,478,665; 3,517,164; 3,621,201; 3,857,189; 3,902,041; 4,021,641; 4,059,394; 4,147,922; 4,464,561; 4,537,492; and 4,596,920.

A coated substrate such as a developer sheet is typically heated in order to provide a glossy finish thereon. Such developer sheets are used in conjunction with conventional pressure-sensitive copy paper or photosensitive imaging systems employing microcapsules to provide visible images upon contact with a color former which is image-wise released from the microcapsules and transferred to the developer sheet.

Photosensitive imaging systems employing microencapsulated radiation sensitive compositions are the subject of commonly assigned U.S. Pat. Nos. 4,399,209 and 4,440,846 as well as copending U.S. Pat. application Ser. No. 339,917, filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color former. Exposure image-wise hardens the internal phase of the microcapsules.

U.S. Pat. No. 4,399,209 discloses a transfer system in which the imaging sheet is assembled with a developer sheet prior to being subjected to a rupturing force. Upon passing through the development station in contact with the developer sheet, the microcapsules rupture and image-wise release the internal phase whereupon the color former migrates to the developer sheet where it reacts with a dry developer and forms a color image. The imaging system can be designed to reproduce monochromatic or polychromatic full color images.

Apparatus for glossing the developer sheets of the foregoing imaging systems are becoming known. Commonly assigned U.S. Pat. application Ser. No. 017,102, filed Feb. 19, 1987 discloses an apparatus for glossing the developer sheets wherein a developer sheet is fed between the convex side of a heated plate and a continuous belt held snugly against the convex side of the plate; the thermoplastic resin side of the developer sheet is adjacent to the belt. Commonly assigned U.S. Pat. application Ser. No. 016,311, filed Feb. 19, 1987 discloses an apparatus for glossing the developer sheets wherein a developer sheet is fed between a heated belt and a source of radiant energy disposed within a reflector; the thermoplastic resin side of the developer sheet is adjacent to the source of radiant energy. A commonly developed apparatus for glossing the developer sheets is disclosed at #27660, *Research Disclosure* (April 1987) wherein a developer sheet is fed between a heated driven roller and an idler roller. Also, a developer sheet can be glossed by placing in a hot oven.

Known processes for glossing sheets suffer from numerous disadvantages. Thermoplastic resins, which are capable of forming a film upon the application of heat, are extremely sticky compared to dry silver film, conventional film, and xerographic copies; thus, the release conditions of the sheet surface are more critical. In hot roller glossing methods, the high contact pressure may cause adhesion of the thermoplastic resin to the hot rollers. In methods involving heated surfaces, adhesion of the thermoplastic resin may also be a problem. Also, known glossing methods do not achieve an even gloss with respect to image density and are also slow. Additionally, the energy requirements of glossing processes are higher than known photographic, glossing, and xerographic toner fusing technologies.

Thus, a need exists in the art for an apparatus for glossing sheets wherein no adhesion of the thermoplastic resin to another surface results and a high throughput is achieved.

SUMMARY OF THE INVENTION

In accordance with the present invention, apparatus is provided for glossing sheets having a thermoplastic resin on one surface thereof. Certain thermoplastic resins are capable of forming a film which imparts gloss to the sheet upon the application of heat. This film is essentially transparent. The film imparts a gloss finish when the image is formed on an opaque background and it transmits light efficiently when the image is formed on a transparent background to provide a transparency. A glossy film improves perceived image quality by increasing color saturation.

The present invention provides an apparatus for glossing a sheet comprising:
  sheet supporting means;
  a first pair of rollers for feeding the sheet onto the sheet supporting means wherein the resin side of the sheet is away from the sheet supporting means;
  heating elements;
  a blower for blowing air through the heating elements to generate hot air which is blown onto the sheet; and
  a second pair of cold rollers for receiving the sheet after passage over the sheet supporting means.

Unlike hot roller apparatus where the high contact pressure of the hot rollers on the sheet causes adhesion of the thermoplastic resin to the hot rollers, the apparatus of the present invention is advantageous because the thermoplastic resin is not in contact with any surface. Hence, the apparatus of the present invention eliminates the adhesion of the thermoplastic resin on the sheet to another surface.

Thus, an object of the present invention is to provide apparatus for glossing sheets.

A further object of the present invention is to provide apparatus for glossing sheets wherein adhesion of the thermoplastic resin on the sheet to another surface is eliminated.

Other objects and advantages of the present invention will become apparent from the following description, the accompanying drawings, and the appended claims.

BRIEF DESCRIPTION OF THE DRAWINGS

FIG. 1 is a cross-sectional schematic view of a developer sheet useful in the apparatus of the present invention;

FIG. 2 is a view of the developer sheet of FIG. 1 after image-wise transfer of the color former thereto;

FIG. 3 is a view of the developer sheet of FIG. 2 after coalescing of the thermoplastic developer resin to provide a high gloss finish;

FIG. 4 is a view of the developer sheet of FIG. 2 after partial coalescing of the thermoplastic developer resin to provide a matte finish;

DETAILED DESCRIPTION OF THE INVENTION

Figure 5:
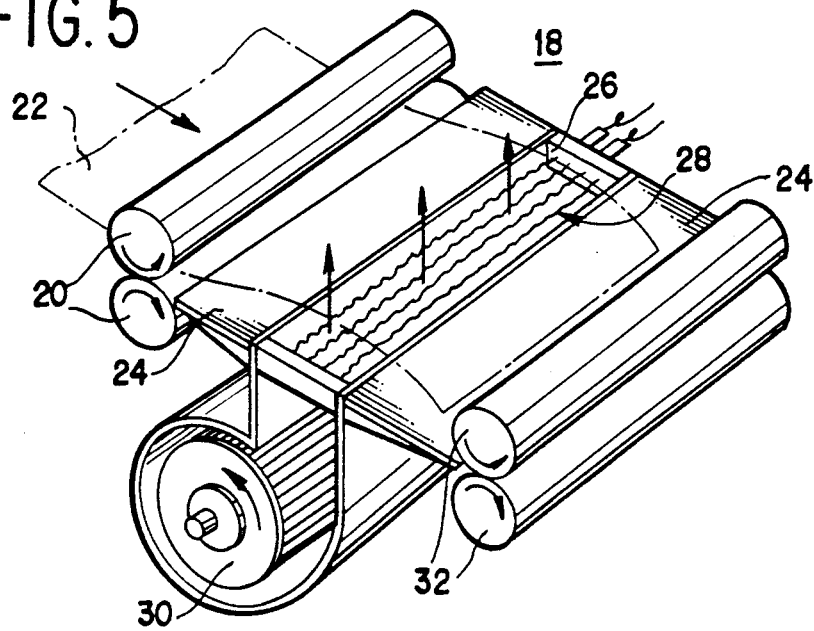
FIGS. 5-8 are views of apparatus of the present invention.

A glassable developer sheet useful in the practice of the present invention is schematically shown in FIG. 1 wherein the developer sheet is designated generally by the reference numeral 10. Particularly useful glossable developer sheets are disclosed in commonly assigned U.S. Pat. application Ser. Nos. 905,727, filed Sept. 9, 1986; 009,176, filed Jan. 30, 1987; and 027,390, filed Mar. 18, 1987; and U.S. Pat. No. 4,554,233. The sheet 10 includes a support 12 which is overcoated by a layer 14 of a finely divided thermoplastic developer resin. Useful materials for the support 12 include both opaque substrates such as paper and transparent substrates such as a polyethylene terephthalate film. However, preferably, the support 12 is paper.

Upon image-wise transfer of a color former to the surface of sheet 10, a visible image 16 is formed in layer 14 as shown by the cross-hatching in FIG. 2. The visible image 16 is usually the product of an acid-base reaction between the color former, which is usually an electron donor, and the thermoplastic developer resin, which is usually an electron acceptor.

After developing the image 16, the developer sheet 10 is subjected to the present invention to gloss the thermoplastic developer resin on the developer sheet. By varying the process temperature, degrees of gloss ranging from matte to low gloss to high gloss can be obtained. For example, FIG. 3 schematically illustrates a high gloss finish on the developer sheet 10. The thermoplastic developer resin 14 is essentially competely coalesced into a thin, continuous, translucent film. An intermediate degree of gloss is schematically shown in FIG. 4 in which partial coalescence of the layer 14 gives a finish which is glossier than the uncoalesced intermediate of FIG. 2 but less glossy than the finish of FIG. 3. Where the developer sheet is to be used as a transparency, the support film is transparent and complete coalescence of the developer resin is used.

Useful developer materials 14 are finely divided reactive thermoplastic pigments which are capable of reacting with a color former and forming a color image. Their melting points typically range from about 100 to 200° C., but those skilled in the art will appreciate that materials with higher and lower melting points may also be useful. Preferably, resins have a melting range of about 120 to 130° C. are used. The particle size is preferably in the range of about 0.5 to 25 microns.

FIG. 5 illustrates a glossing unit 18 of the present invention. A first set of rollers 20 is used to feed the sheet 22 onto the transport platform 24. Warm rollers can be used to preheat the resin layer so that less energy is required during the hot air step. The thermoplastic resin side of the sheet 22 is away from the transport platform 24. The transport platform 24 has a slot 26 therein; the slot 26 is a heating fan outlet which extends substantially across the width of the transport platform 24.

Heating elements 28 are located below the slot 26 in the transport platform 24 to provide heat for glossing. In order to provide sufficient heat for glossing the thermoplastic resin, useful heating elements 28 operate at a temperature of about 1250° to 1750° C. A blower 30 is located beneath the heating elements 28 for blowing air through the heating elemnts 28 to generate hot air which is uniformly blown onto the sheet 22. A useful blower 30 blows about 0.283 to 2.83 m³/min of air onto sheet 28. The light air pressure exerted on the sheet 22 raises the sheet 22 off the transport platform 24; this action ensures even thermal contact because the sheet 22 is then backed by an air gap.

After a sufficient portion of the sheet 22 has been fed beyond the heating fan outlet, the sheet 22 falls back onto the transport platform 24. After the sheet 22 has passed over the transport platform 24, a second set of cold rollers 32 receives the sheet 22 and ejects the sheet 22 from the glossing unit 18. It should be understood that the distance between the first set of cold rollers 20 and the second set of cold rollers 32 is equal to or less than the length of sheet 22 in order for the rollers to move the sheet over transport platform 24 as shown in FIG. 5.

Figure 6:
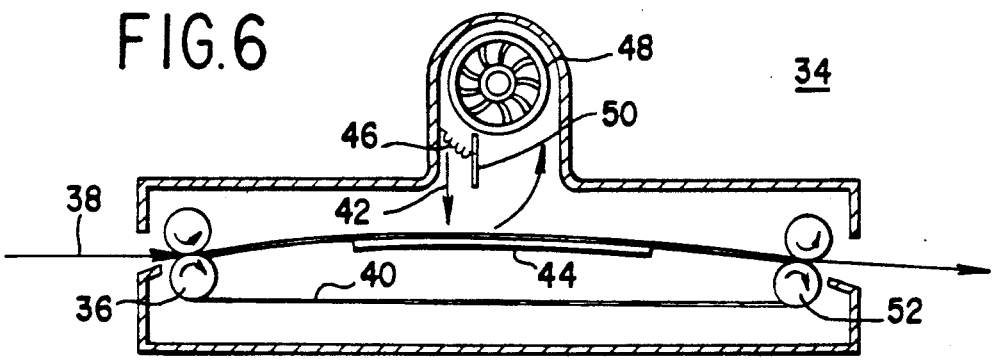

FIG. 6 illustrates a second glossing unit 34 of the present invention. A first set of rollers 36 is used to feed the sheet 38 onto a belt 40. Warm rollers can be used to preheat the resin layer so that less energy is required during the hot air step. Typically, the belt 40 is placed around roller means. The belt 40 transports the sheet 38 through the glossing unit 34. The thermoplastic resin side of the sheet 38 is away from the belt 40. At the heat application location 42, support means 44 is located beneath belt 40 t provide support for the belt 40 and also for sheets 38 situated on belt 40. Preferably, the support means 44 has a nonconductive surface. Otherwise, if a conductive surface is used, hot spots can occur, and also, the heat would be distributed throughout the glossing unit 34. Heating pads which contact the back surface of support means 44 can be used so as to increase throughput.

Heating elements 46 are located above belt 40 at the heat application location 42 to provide heat for the glossing. In order to provide sufficient heat for glossing the thermoplastic resin, useful heating elements 46 operate at a temperature of about 1250° to 1750° C. A blower 48 is located above the heating elements 46 for blowing air through the heating elements 46 to generate hot air which is uniformly blown onto the sheet 38. A useful blower 48 blows about 0.283 to 2.83 m³/min of air onto sheet 38. Preferably, the sheet 38 has been heated prior to entering the glossing unit 34 so that the sheet 38 will not act as a heat sink with respect to the hot air blown onto sheet 38. A vertical baffle 50 is situated near the heating elements 46 so that the hot air is directed in a narrow cross section across the width of the sheet 38 as indicated by the arrow.

After the hot air is blown onto the sheet 38, the air is circulated back through the blower 48 as indicated by the arrow. As a result of the air recirculation, the energy requirements of the glossing unit 34 are decreased.

After the sheet 38 has passed beyond the heat application area 42, a second set of cold rollers 52 receives the sheet 38 and ejects the sheet 38 from the glossing unit 34.

Figure 7:
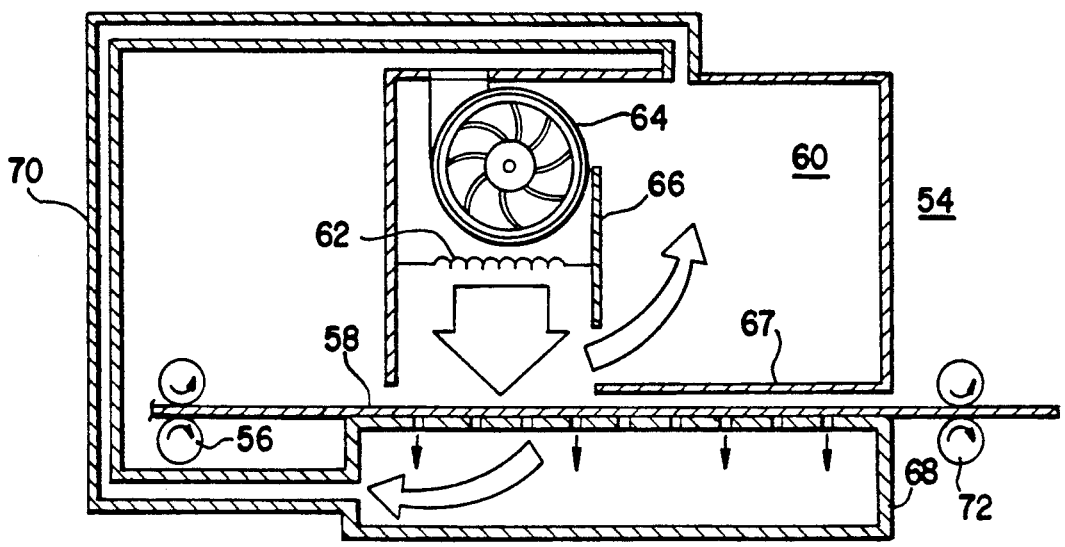

FIG. 7 illustrates a further glossing unit 54 of the present invention. A first set of rollers 56 is used to feed the sheet 58 into the glossing unit 54. Again, warm rollers can be used to preheat the resin so that less energy is required during the hot air step. The thermoplastic resin side of the sheet 58 is away from the sheet supporting means.

A means is located above the sheet supporting means for blowing hot air onto the sheet 58. The means comprises a housing 60 having heating elements 62 located therein to provide heat for the glossing. In order to provide sufficient heat for glossing the thermoplastic resin, useful heating elements 62 operate at a temperature of about 1250° to 1750° C. A blower 64 is located in the housing 60 for blowing air through the heating elements 62 to generate hot air which is uniformly blown onto sheet 58 through an opening which extends across the width of sheet 58 as indicated by the arrow. A useful blower 64 blows about 0.283 to 2.83 m³/min of air onto sheet 58. A vertical baffle 66 is situated near the heating elements 62 so that the hot air is directed onto the sheet 58 through an opening which extends across the width of sheet 58 as indicated by the arrow. A portion of the hot air passes beneath the baffle 66 and over the baffle 67, and is circulated back through the blower 64 as indicated by the arrow. The horizontal baffle 67 helps to prevent fluttering, due to the air flow, of the sheet 58 as it passes through glossing unit 54.

Vacuum means 68 is located below the belt 56 for sucking in the hot air. The application of the vacuum as shown by the multiple arrows helps to ensure that the sheet 58 does not flutter due to the air application as the sheet 58 passes over the horizontal upper surface of vacuum means 68. The glossing unit 54 also includes air recirculation means 70. Typically, the air recirculation means 70 comprises a pipe which runs from the vacuum means 68 to the housing 60; the air flows as shown by the arrow through air recirculation means 70 and back through blower 64. Although not illustrated, it should be understood that the air recirculation means 70 is positioned so that it does not interfere with the feeding of sheets 58 into the glossing unit 54. As a result of the air recirculation, the energy requirements of the glossing unit 54 are less than other units. When the sheet 58 is emerging from the glossing unit 54, a second set of cold rollers 72 receives the sheet 58 and ejects the sheet 58 from the glossing unit 54. It should be understood that the distance between the first set of cold rollers 56 and the second set of cold rollers 72 is equal to or less than the length of sheet 58 in order for the rollers to move the sheet over vacuum means 68.

Figure 8:
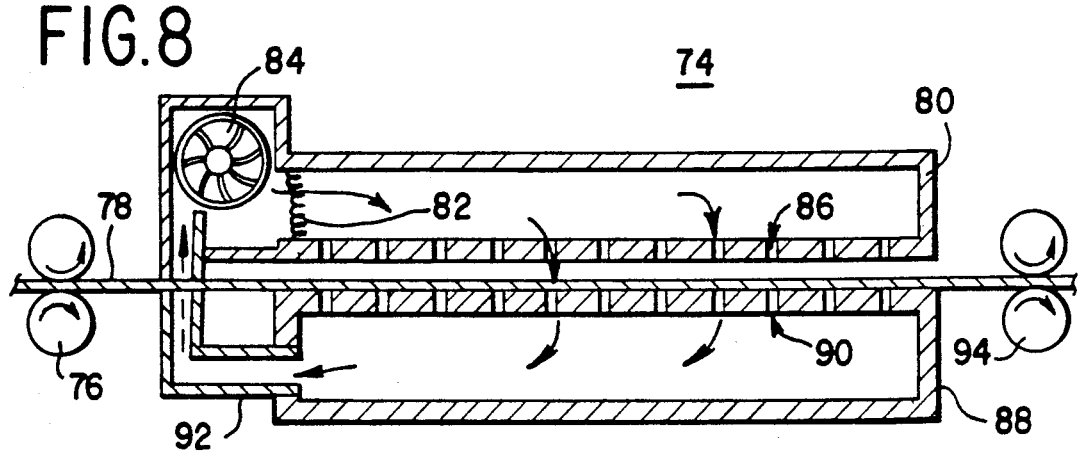

FIG. 8 illustrates a further glossing unit 74 of the present invention. A first set of rollers 76 is used to feed the sheet 78 into the glossing unit 74. Again, warm rollers can be used. The thermoplastic resin side of the sheet 78 is away from the sheet supporting means.

A manifold is located above the sheet supporting means for blowing hot air onto the sheet 78. An air gap exists between the bottom of the manifold and the thermoplastic resin side of the sheet 78. The manifold comprises a housing 80 having heating elements 82 located therein to provide heat for the glossing. In order to provide sufficient heat for glossing the thermoplastic 10 resin, useful heating elements 82 operate at a temperature of about 1250° to 2750° C. A blower 84 is located in the housing 80 for blowing air as shown by the arrow through the heating elements 82 to generate hot air which is uniformly blown onto the entire surface of sheet 78. A useful blower 84 blows about 0.283 to 2.83 m³/min of air onto the entire surface of the sheet 78. Preferably, the housing 80 is a pressure manifold.

Figure 9:
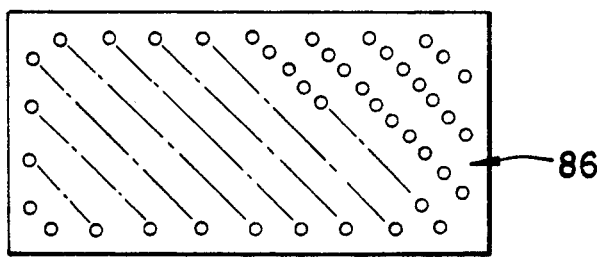
FIG. 9 is a top view through the lower surface of the pressure manifold of FIG. 8.

In order to evenly distribute the hot air over the sheet 78, the lower surface 86 of the pressure manifold has a plurality of holes therein in a regular pattern. The term regular as used herein means that the distances between holes are regular or constant. A particularly useful regular pattern of holes is the pattern shown in FIG. 9.

Vacuum means 88 for sucking in the hot air is located below housing 80. Preferably, the vacuum means 88 is a vacuum manifold. The application of the vacuum as shown by the multiple arrows helps to ensure that the sheet 78 does not flutter due to the air application as it passes over the horizontal upper surface 90 of vacuum means 88.

Figure 10:
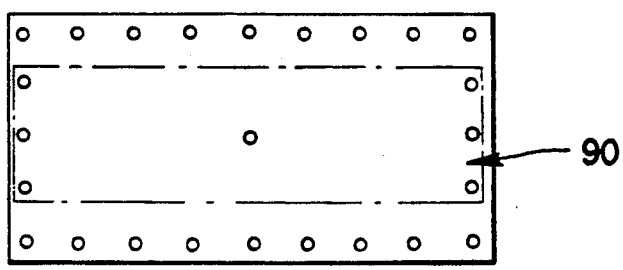
FIG. 10 is a top view through the upper surface of the vacuum manifold of FIG. 8.

As shown in FIG. 10, the upper surface 90 of the vacuum manifold has a plurality of holes therein. The innermost section, which is outlined by dotted lines, corresponds to the area of the sheet 78 for holding the sheet 78 down; the perimeter section has holes in a regular pattern for passage of the hot air therethrough.

The glossing unit 74 also includes air recirculation means 92. Typically, the air recirculation means 92 comprises a pipe which runs from the vacuum manifold to the pressure manifold; the air flows as shown by the arrow through air recirculation means 92 and back through blower 84. As illustrated, the air recirculation means 92 is positioned so that it does not interfere with the feeding of sheets 78 into the glossing unit 74. As a result of the air recirculation, the energy requirements of the glossing unit 74 are less than other units. When the sheet 78 is emerging from the glossing unit 74, a second set of cold rollers 94 receives the sheet 78 and ejects the sheet 78 from the glossing unit 74. It should be understood that the distance between the first set of cold rollers 76 and the second set of cold rollers 94 is equal to or less than the length of sheet 78 in order for the rollers to move the sheet over the vacuum manifold.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. An apparatus for glossing a sheet having a thermoplastic resin on the surface thereof, said thermoplastic resin being capable of forming a film which imparts gloss upon the application of heat, comprising:

sheet supporting means;

sheet feeding means for feeding said sheet onto said supporting means, passing said sheet along said supporting means, and removing said sheet from said supporting means, thereby defining a sheet feeding path, wherein the resin side of said sheet is away from said sheet supporting means;

a housing mounted above said supporting means;

a heating element mounted within said housing;

a blower mounted for blowing air through said heating element to generate hot air which is blown onto said sheet;

said housing defining an open lower end adjacent said supporting means;

a first baffle mounted within said housing for directing air flow from said blower through said heating element and toward said open end;

a second baffle mounted at a lower portion of said housing to extend over and parallel to said feeding path, said second baffle closing a portion of said open end and terminating so as to define an opening at a lower portion of said housing;

said first baffle further terminating at a lower end remote from said second baffle, whereby said first baffle further defines a recirculation path from said opening to said blower, and said second baffle provides a shield for a sheet moved by said feeding means past said opening.

2. The apparatus of claim 1 wherein said feeding means includes a first pair of rollers for feeding said sheet onto said sheet supporting means, and a second pair of rollers for receiving said sheet after passage over said sheet supporting means.

3. An apparatus for glossing a sheet having a thermoplastic resin on the surface thereof, said thermoplastic resin being capable of forming a film which imparts gloss upon the application of heat, comprising:

sheet supporting means;

sheet feeding means for feeding said sheet onto said supporting means, passing said sheet along said supporting means, and removing said sheet from said supporting means;

a heating element;

a blower for blowing air through said heating element to generate hot air;

a housing mounted above said sheet supporting means and mounting said blower and said heating element to direct air from said blower and onto a sheet on said supporting means;

a vacuum manifold mounted beneath said housing and having an upper surface, a first portion of said upper surface defining a portion of said sheet supporting means and a second portion of said upper surface being remote from said sheet supporting means, said upper surface further defining a plurality of inlet openings;

said inlet openings positioned on said upper surface with a greater number of said inlet openings defined in said second portion for removal of air from the vicinity of the sheet in said first portion for holding the sheet; and means connecting said vacuum manifold with said housing to provide an air recirculation path.

4. The apparatus of claim 3 wherein said housing further includes a lower surface having a plurality of outlet openings for directing air from said housing onto said sheet.

* * * * *